US009460791B1

(12) United States Patent
Shallal et al.

(10) Patent No.: US 9,460,791 B1
(45) Date of Patent: Oct. 4, 2016

(54) DATA CLOCK SYNCHRONIZATION IN HYBRID MEMORY MODULES

(71) Applicant: INPHI CORPORATION, Santa Clara, CA (US)

(72) Inventors: Aws Shallal, Santa Clara, CA (US); Larry Grant Giddens, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 14/963,082

(22) Filed: Dec. 8, 2015

(51) Int. Cl.
*G11C 7/22* (2006.01)
*G11C 7/10* (2006.01)
*G11C 11/4076* (2006.01)
*G11C 14/00* (2006.01)
*G11C 16/32* (2006.01)
*G11C 7/08* (2006.01)

(52) U.S. Cl.
CPC ....... *G11C 14/0018* (2013.01); *G11C 11/4076* (2013.01); *G11C 16/32* (2013.01); *G11C 7/08* (2013.01); *G11C 7/10* (2013.01); *G11C 7/1057* (2013.01); *G11C 7/1066* (2013.01); *G11C 7/1093* (2013.01); *G11C 7/222* (2013.01)

(58) Field of Classification Search
CPC ..... G11C 7/222; G11C 11/4076; G11C 7/22; G11C 7/1066; G11C 7/1093; G11C 7/08; G11C 7/10
USPC ................... 365/194, 189.05, 233.1
See application file for complete search history.

(56) References Cited

U.S. PATENT DOCUMENTS

| 2013/0077382 | A1* | 3/2013 | Cho | G11C 5/04 365/148 |
| 2013/0332667 | A1* | 12/2013 | Uchigaito | G11C 7/1072 711/105 |
| 2014/0192583 | A1* | 7/2014 | Rajan | G11C 7/10 365/63 |
| 2015/0109871 | A1* | 4/2015 | Bains | G06F 13/1636 365/222 |
| 2016/0011966 | A1* | 1/2016 | Keeler | G06F 12/0246 711/103 |

* cited by examiner

*Primary Examiner* — Ly D Pham
(74) *Attorney, Agent, or Firm* — Richard T. Ogawa; Ogawa P.C.

(57) ABSTRACT

Disclosed herein are techniques for implementing data clock synchronization in hybrid memory modules. Embodiments comprise a clock synchronization engine at a command buffer to generate a synchronized data clock having a phase relationship with data signals from a non-volatile memory controller that compensates for various synchronous and/or asynchronous delays to facilitate latching of the data signals at certain DRAM devices (e.g., during data restore operations). Other embodiments comprise a divider to determine the frequency of the synchronized data clock by dividing a local clock signal from the non-volatile memory controller by a selected divider value. Some embodiments comprise a set of synchronization logic that invokes the generation of the synchronized data clock signal responsive to receiving a certain local command and/or frame pulse from the non-volatile memory controller. In other embodiments, certain fixed and/or programmable delay elements can be implemented to compensate for various asynchronous delays.

20 Claims, 8 Drawing Sheets

DATA CLOCK SYNCHRONIZATION IN HYBRID MEMORY MODULES

FIELD

This disclosure relates to the field of memory systems and more particularly to techniques for data clock synchronization in hybrid memory modules.

BACKGROUND

As the massive volumes of electronically stored and transmitted data (e.g., "big data") continue to increase, so does the need for electronic data storage that is reliable and cost effective, yet quickly accessible (e.g., low latency). Specifically, more computing applications are requiring that increasingly larger data sets be stored in "hot" locations for high speed access. Certain non-volatile memory (NVM) storage technologies, such as magnetic hard disk drives (HDDs), can provide a reliable, low cost storage solution, yet with relatively high access latencies. Such storage technologies might be used for large volumes of data in "cold" locations that are not often accessed (e.g., data warehouses, archives, etc.). Other volatile or "dynamic" memory storage technologies, such as dynamic random access memory (DRAM), provide lower access latencies, and might be used in "hot" locations near a computing host (e.g., CPU) to offer fast access to certain data for processing. Yet, such storage technologies can have a relatively high cost and risk of data loss (e.g., on power loss). Solid state NVM, such as Flash memory, can offer an improved form factor and access latency as compared to an HDD, yet still not approach the access latency of DRAM.

In some cases, DRAM and Flash can be combined in a hybrid memory module to deliver the fast data access of the DRAM and the non-volatile data integrity (e.g., data retention) enabled by the Flash memory. One such implementation is the non-volatile dual in-line memory module (NVDIMM), which stores data in DRAM for normal operation, and stores data in Flash for backup and/or restore operations (e.g., responsive to a power loss, system crash, normal system shutdown, etc.). Specifically, for example, the JEDEC standards organization has defined the NVDIMM-N product for such backup and/or restore applications. Many NVDIMM implementations can further be registered DIMMs (RDIMMs), which can use hardware registers and other logic, such as included in a registering clock driver (RDC), to buffer the address and control signals to the DRAM devices in order to expand the capacity of the memory channels. Other NVDIMM implementations can be load-reduced DIMMs (LRDIMMs), which can include data buffers to buffer the data signals in order to reduce the loading on the data bus and expand the capacity of the memory channels.

Unfortunately, legacy hybrid memory module architectures can have functional and performance limitations. Specifically, certain NVDIMM designs use the non-volatile memory controller (NVC) communications interface for DRAM read and write commands during data backup and data restore operations. In some cases, the phase relationship between the data transmitted to the DRAM from the NVC (e.g., during data restore) and the data clock provided by the RDC might be unknown. For example, various asynchronous delays (e.g., propagation delays, gate delays, buffer delays, printed circuit board trace delays, etc.) and/or synchronous delays (e.g., deterministic delays, logic stage delays, flip-flop delays, etc.) might be present in the NVDIMM. Such timing uncertainties can limit the performance and/or reliability of the hybrid memory module. Some legacy hybrid memory modules are further limited in the frequency of the data clock from the RDC as compared to the operating clock (e.g., local clock) of the NVC. Specifically, some designs can produce a data clock having a fixed divide-by-four relationship with the local clock. Such fixed ratios can limit the performance of the hybrid memory module at least as pertains to burst control flexibility, power management flexibility, maximum data clock frequency, restore latencies, NVC to RCD communication latencies, and other performance characteristics. For example, to increase the frequency of the data clock to improve the latency of restore operations, the local clock might need to be overclocked, which can, in turn, lead to increased power consumption.

Techniques are therefore needed to address the problems of implementing a hybrid memory module with a DRAM data clock having selectable frequencies that is synchronized with the data written to the DRAM during data restore operations. None of the aforementioned legacy approaches achieve the capabilities of the herein-disclosed techniques, therefore, there is a need for improvements.

SUMMARY

The present disclosure provides an improved method, system, and computer program product suited to address the aforementioned issues with legacy approaches. Specifically, the present disclosure provides a detailed description of techniques used in implementing data clock synchronization in hybrid memory modules.

More specifically, the present disclosure provides a detailed description of techniques for implementing data clock synchronization in hybrid memory modules. The claimed embodiments address the problem of implementing a hybrid memory module with a DRAM data clock having selectable frequencies that is synchronized with the data written to the DRAM during data restore operations.

Some embodiments of the present disclosure are directed to approaches for providing a clock synchronization engine at a command buffer to generate a synchronized data clock having a phase relationship with data signals from a non-volatile memory controller that compensates for various synchronous and/or asynchronous delays to facilitate latching of the data signals at certain DRAM devices (e.g., during data restore operations). In one or more embodiments, the frequency of the synchronized data clock is determined by a divider that divides a local clock signal from the non-volatile memory controller by a selected divider value (e.g., 1, 2, 4, etc.). In other embodiments, a set of synchronization logic can invoke the generation of the synchronized data clock signal responsive to receiving a certain local command and/or frame pulse from the non-volatile memory controller. In other embodiments, certain fixed and/or programmable delay elements can be implemented to compensate for various asynchronous delays.

Further details of aspects, objectives, and advantages of the disclosure are described below and in the detailed description, drawings, and claims. Both the foregoing general description of the background and the following detailed description are exemplary and explanatory, and are not intended to be limiting as to the scope of the claims.

BRIEF DESCRIPTION OF THE DRAWINGS

The drawings described below are for illustration purposes only. The drawings are not intended to limit the scope of the present disclosure.

DETAILED DESCRIPTION

Embodiments of the present disclosure address problems attendant to electronic data storage subsystem architectures (e.g., memory modules) that are exhibited in situations such as during backup and restore operations.

OVERVIEW

Addressed herein are figures and discussions that teach how to implement a clock synchronization engine at a command buffer (e.g., RCD) in a hybrid memory module to generate a synchronized data clock having a phase relationship with data signals from a non-volatile memory controller that compensates for various synchronous and/or asynchronous delays to facilitate latching of the data signals at certain DRAM devices during data restore operations and/or other hybrid memory module operations. More particularly, disclosed herein and in the accompanying figures are exemplary environments, methods, and systems for data clock synchronization in hybrid memory modules.

DEFINITIONS

Some of the terms used in this description are defined below for easy reference. The presented terms and their respective definitions are not rigidly restricted to these definitions—a term may be further defined by the term's use within this disclosure.

The term "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

As used in this application and the appended claims, the term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances.

The articles "a" and "an" as used in this application and the appended claims should generally be construed to mean "one or more" unless specified otherwise or is clear from the context to be directed to a singular form.

The term "logic" means any combination of software or hardware that is used to implement all or part of the disclosure.

The term "non-transitory computer readable medium" refers to any medium that participates in providing instructions to a logic processor.

A "module" includes any mix of any portions of computer memory and any extent of circuitry including circuitry embodied as a processor.

Reference is now made in detail to certain embodiments. The disclosed embodiments are not intended to be limiting of the claims.

DESCRIPTIONS OF EXEMPLARY EMBODIMENTS

Figure 1A:
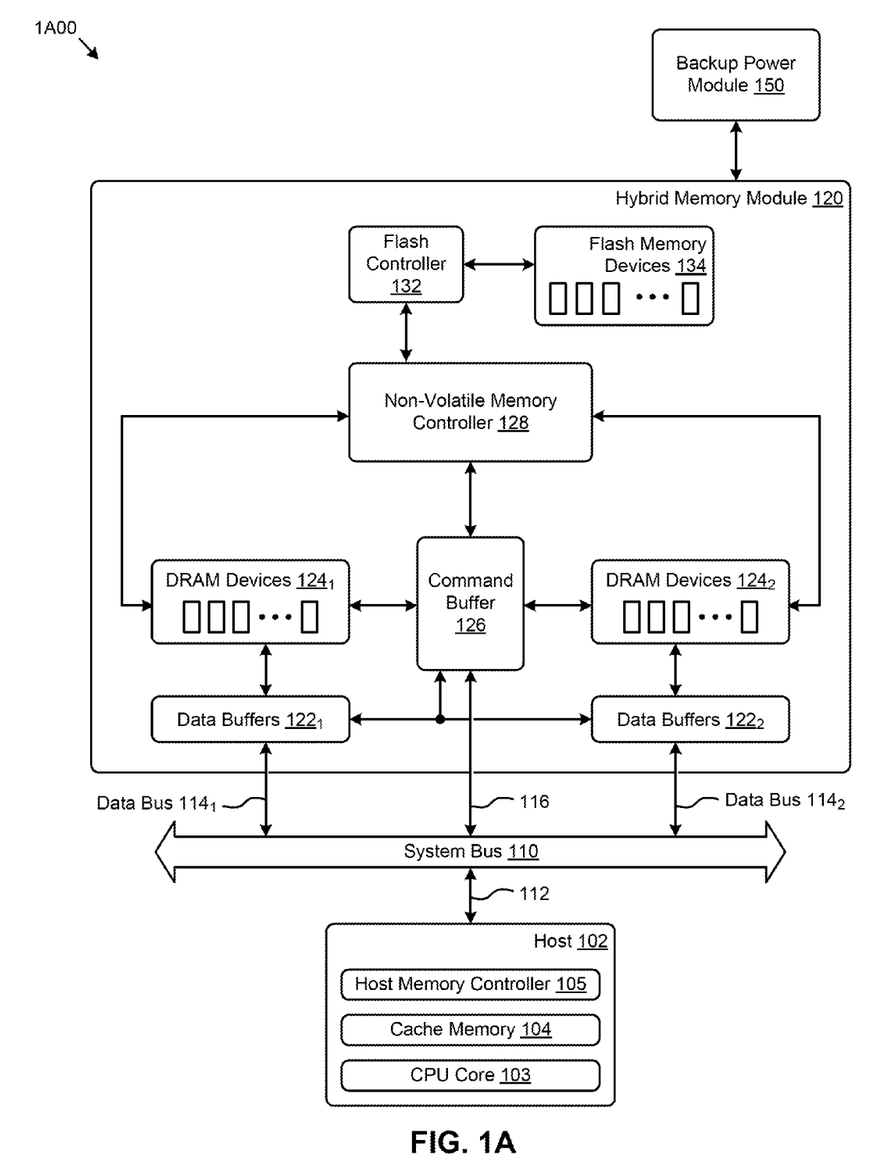
FIG. 1A depicts an environment showing a hybrid memory module.

FIG. 1A depicts an environment 1A00 showing a hybrid memory module. As an option, one or more instances of environment 1A00 or any aspect thereof may be implemented in the context of the architecture and functionality of the embodiments described herein. Also, the environment 1A00 or any aspect thereof may be implemented in any desired environment.

As shown in FIG. 1A, environment 1A00 comprises a host 102 coupled to a hybrid memory module 120 through a system bus 110. The host 102 further comprises a CPU core 103, a cache memory 104, and a host memory controller 105. Host 102 can comprise multiple instances each of CPU core 103, cache memory 104, and host memory controller 105. The host 102 of environment 1A00 can further be based on various architectures (e.g., Intel x86, ARM, MIPS, IBM Power, etc.). Cache memory 104 can be dedicated to the CPU core 103 or shared with other cores. The host memory controller 105 of the host 102 communicates with the hybrid memory module 120 through the system bus 110 using a physical interface 112 (e.g., compliant with the JEDEC DDR4 SDRAM standard, etc.). Specifically, the host memory controller 105 can write data to and/or read data from a first set of DRAM devices $124_1$ and a second set of DRAM devices $124_2$ using a data bus $114_1$ and a data bus $114_2$, respectively. For example, the data bus $114_1$ and the data bus $114_2$ can transmit the data as electronic signals such as a data signal, a chip select signal, or a data strobe signal. The DRAM devices $124_1$ and/or the DRAM devices $124_2$ might each comprise an array of eight or nine DDR4 memory devices (e.g., SDRAM) arranged in various topologies (e.g., AB sides, single-rank, dual-rank, quad-rank, etc.). Other memory devices (e.g., DDR3 memory devices) can comprise the DRAM devices. In some cases, as shown, the data to and/or from the DRAM devices $124_1$ and the DRAM devices $124_2$ can be buffered by a set of data buffers $122_1$ and data buffers $122_2$, respectively. Such data buffers can serve to boost the drive of the signals (e.g., data or DQ signals, etc.) on the system bus 110 to help mitigate high electrical loads of large computing and/or memory systems.

Further, commands from the host memory controller 105 can be received by a command buffer 126 (e.g., registering clock driver or RCD) at the hybrid memory module 120 using a command and address (CA) bus 116. For example, the command buffer 126 might be a registering clock driver (RCD) such as included in registered DIMMs (e.g., RDIMMs, LRDIMMs, etc.). Command buffers such as command buffer 126 can comprise a logical register and a phase-lock loop (PLL) to receive and re-drive command and address input signals from the host memory controller 105 to the DRAM devices on a DIMM (e.g., DRAM devices 124$_1$, DRAM devices 124$_2$, etc.), reducing clock, control, command, and address signal loading by isolating the DRAM devices from the host memory controller 105 and the system bus 110. In some cases, certain features of the command buffer 126 can be programmed with configuration and/or control settings.

The hybrid memory module 120 shown in FIG. 1A further comprises a non-volatile memory controller 128 coupled to a flash controller 132 and a set of flash memory devices 134. The presence of the flash memory devices 134 (e.g., NAND flash memory chips) and the DRAM devices on a dual in-line memory module (DIMM), in part, defines the "hybrid" characteristic of the hybrid memory module 120, at least according to JEDEC. Such hybrid memory modules can be referred to as non-volatile DIMMs (NVDIMMs), and can appear as a DRAM DIMM to the system controller (e.g., host memory controller 105) and/or share a memory channel with other DRAM DIMMs. For example, JEDEC has identified three NVDIMM configurations as follows:

NVDIMM-N: A hybrid memory module consisting of DRAM made persistent through the use of Flash memory. No Flash memory beyond that needed for persistence operations (e.g., data backup, data restore, etc.) is accessible by the host memory controller.

NVDIMM-P: A hybrid memory module consisting of DRAM made persistent through the use of Flash memory. Flash memory beyond that needed for persistence is accessible by the host memory controller as a block-oriented mass storage device.

NVDIMM-F: A hybrid memory module consisting of Flash memory accessed by the host memory controller as a block-oriented mass storage device.

The hybrid memory module 120 shown in environment 1A00 can be considered an NVDIMM-N configuration. As such, a backup power module 150 is shown coupled to the hybrid memory module 120 to deliver power to the hybrid memory module 120 during persistence operations such as data backup and data restore in the event of a system power loss. For example, the backup power module 150 might comprise super capacitors (e.g., supercaps) and/or battery packs attached to the hybrid memory module 120 via a tether cable and store enough charge to keep at least a portion of the hybrid memory module 120 powered up long enough to copy all of its data from the DRAM to the flash memory. As shown, data can be transmitted between the DRAM devices and the non-volatile memory controller 128 through a direct data transmission path. In some configurations, the DRAM devices can be port switched devices, each comprising a first port coupled to the data bus (e.g., data bus 114$_1$, data bus 114$_2$), and a second port coupled to the direct data transmission path from the non-volatile memory controller 128. In such cases, the first port can be disabled and the second port can be enabled when transmitting data between the DRAM devices and the flash memory devices (e.g., during data backup and data restore operations). In other configurations (e.g., LRDIMMs), the non-volatile memory controller 128 can connect to the DRAM devices through the data buffers.

Further details related to such direct data transmission paths are disclosed in U.S. patent application Ser. No. 14/884,496, entitled "HYBRID MEMORY MODULE WITH IMPROVED INTER-MEMORY DATA TRANSMISSION PATH" filed on Oct. 15, 2015, the contents of which is hereby incorporated by reference in its entirety in the present application.

Further, the hybrid memory module 120 shown in environment 1A00 presents merely one partitioning. The specific example shown where the command buffer 126, the non-volatile memory controller 128, and the flash controller 132 are separate components is purely exemplary, and other partitioning is reasonable. For example, any or all of the components comprising the hybrid memory module 120 and/or other components can comprise one device (e.g., system-on-chip or SoC), multiple devices in a single package or printed circuit board, multiple separate devices, and can have other variations, modifications, and alternatives.

Unfortunately, legacy hybrid memory module architectures can have functional and performance limitations. Specifically, some hybrid memory modules (e.g., NVDIMMs) can exhibit problems attendant to implementing a DRAM data clock having selectable frequencies that is synchronized with the data written to the DRAM by an NVC (e.g., non-volatile memory controller 128) during data restore operations. The herein disclosed techniques address such limitations and other legacy issues as described in the following and throughout.

Figure 1B:
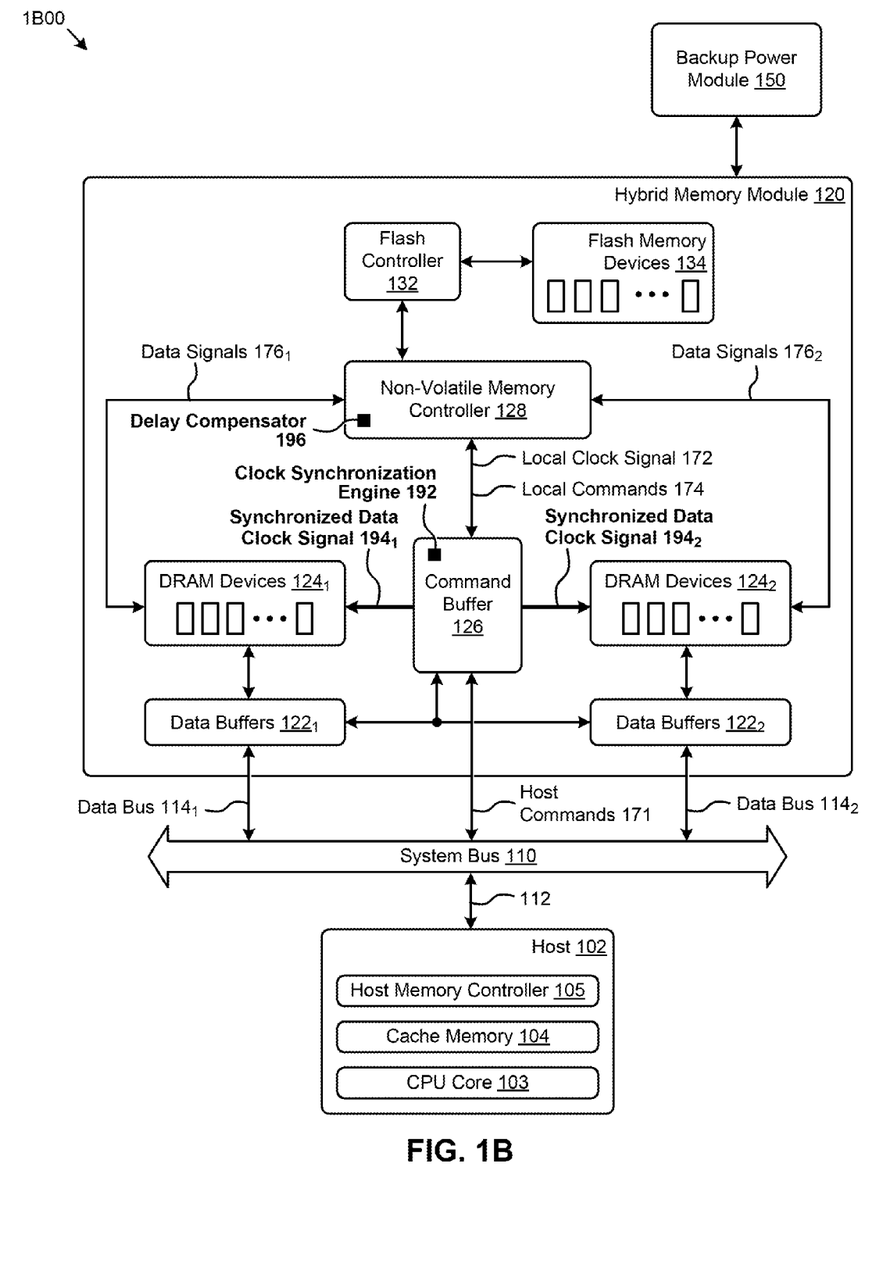
FIG. 1B is a diagrammatic representation of a data clock synchronization technique to facilitate data restore operations in hybrid memory modules, according to an embodiment.

FIG. 1B is a diagrammatic representation of a data clock synchronization technique 1B00 to facilitate data restore operations in hybrid memory modules. As an option, one or more instances of data clock synchronization technique 1B00 or any aspect thereof may be implemented in the context of the architecture and functionality of the embodiments described herein. Also, the data clock synchronization technique 1B00 or any aspect thereof may be implemented in any desired environment.

As shown in FIG. 1B, the data clock synchronization technique 1B00 is depicted in the environment 1A00 comprising the hybrid memory module 120. The data clock synchronization technique 1B00 can address the problems attendant to implementing a hybrid memory module with a DRAM data clock having selectable frequencies that is synchronized with the data written to the DRAM by an NVC (e.g., non-volatile memory controller 128) during data restore operations. Specifically, in some embodiments, the command buffer 126 can receive a local clock signal 172 from the non-volatile memory controller 128 to be used, in part, to provide at least one synchronized data clock signal (e.g., synchronized data clock signal 194$_1$ and synchronized data clock signal 194$_2$) to the DRAM devices (e.g., DRAM devices 124$_1$ and DRAM devices 124$_2$, respectively). More specifically, the command buffer 126 can comprise a clock synchronization engine 192 to generate the synchronized data clock signal based on the local clock signal 172. The clock synchronization engine 192 can provide a phase relationship between the synchronized data clock signal and the data signals (e.g., data signals 176$_1$ and data signals 176$_2$) from the non-volatile memory controller 128 to facilitate latching of the data signals at the DRAM devices. For example, with a known (e.g., to a calculable statistical certainty and/or tolerance) phase relationship between the local clock signal 172 and the data signals at the non-volatile memory controller 128, and a known phase relationship between the local clock signal 172 and the synchronized data clock signal generated by the clock synchronization engine 192, the phase relationship between the synchronized data clock signal and the data signals can also be known to a within a tolerance that complies with the timing requirements of the DRAM devices. In some embodiments, the clock synchronization engine 192 can further facilitate selection of the frequency of the synchronized data clock signal, at least as related to the frequency of the local clock signal 172. For example, the ratio of the local clock signal frequency to the data clock signal frequency might be selectable as one, two, four, and/or any other ratio. In other embodiments, the clock synchronization engine 192 can invoke the generation of the synchronized data clock signal responsive to receiving an instance of local commands 174 from the non-volatile memory controller 128. Other embodiments can comprise a delay compensator 196 at the non-volatile memory controller 128 that can be used to adjust the phase relationship between the data signals and the local clock signal 172 to compensate for various asynchronous delays present in the hybrid memory module 120. The clock synchronization engine 192 can also comprise a delay controller to adjust for asynchronous delays. In some cases, the delay compensator 196 and/or the delay controller of the clock synchronization engine 192 can use programmable delay elements to perform such asynchronous delay compensation adjustments. In other cases, fixed delay elements, PLL clock shifts, and/or other techniques can be implemented in the design of various components shown in FIG. 1B to compensate for an expected range of asynchronous delays.

Further details pertaining to the data clock synchronization technique 1B00 to facilitate data restore operations in hybrid memory modules are disclosed in the following and herein.

Figure 2A:
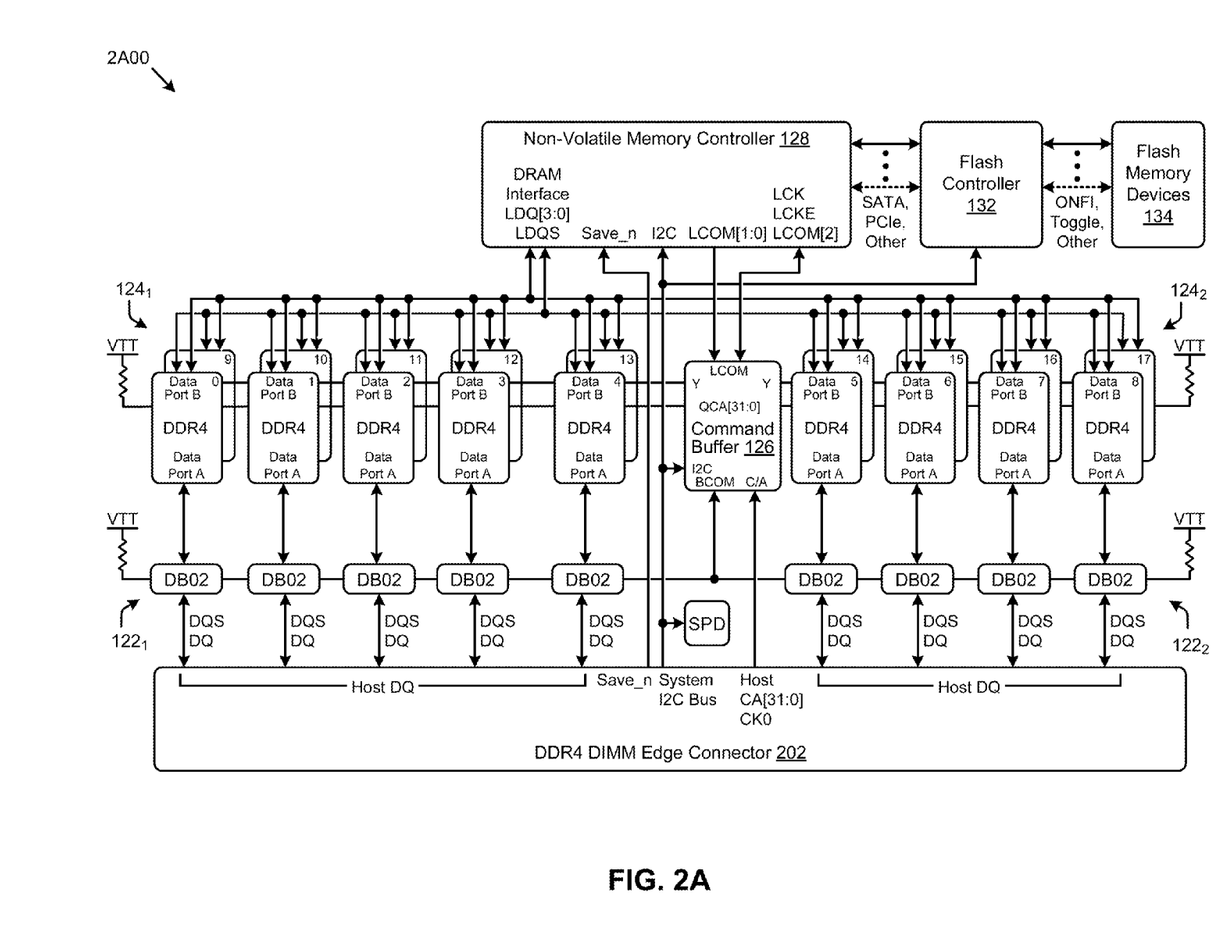
FIG. 2A is a schematic of a hybrid memory module.

FIG. 2A is a schematic of a hybrid memory module 2A00. As an option, one or more instances of hybrid memory module 2A00 or any aspect thereof may be implemented in the context of the architecture and functionality of the embodiments described herein. Also, the hybrid memory module 2A00 or any aspect thereof may be implemented in any desired environment.

The hybrid memory module 2A00 is one example of a hybrid memory module configuration. Specifically, the DRAM devices of the hybrid memory module 2A00 comprise 18 DDR4 devices (e.g., ten instances of DRAM devices $124_1$ and eight instances of DRAM devices $124_2$) having data signals (e.g., DQ, DQS, etc.) delivered to a DDR4 DIMM edge connector 202 through a plurality of data buffers (e.g., five instances of data buffers $122_1$ and four instances of data buffers $122_2$). In some cases, two DDR4 devices can share the high bit rate signal connections to a respective data buffer (e.g., DB02 device) in a parallel configuration (e.g., using the DDR4 Data Port A). Further, a first portion of the DDR4 devices (e.g., DDR4-0 to DDR4-4, and DDR4-9 to DDR4-13) can comprise an A-side of the DRAM configuration, and a second portion of the DDR4 devices (e.g., DDR4-5 to DDR4-8 and DDR4-14 to DDR4-17) can comprise a B-side of the DRAM configuration. In some cases, such configurations can be detected by a serial presence detector or SPD at module initialization. The non-volatile memory controller 128 can further have access to the DDR4 device data through a data signal bus (e.g., comprising LDQ[3:0], LDQS, etc.) between the DRAM devices (e.g., using the DDR4 Data Port B) and the "DRAM Interface" of the non-volatile memory controller 128.

As shown, the command buffer 126 can receive commands, addresses, clocks, and other information through the DDR4 DIMM edge connector 202 at an input command/address or C/A interface. In a host control mode, for example, the command buffer 126 can communicate (e.g., forward DRAM commands) with the DDR4 devices using an output control/address/command interface (e.g., comprising QCA[31:0]) and an output clock (e.g., Y clock) derived from the host clock (e.g., CK0 clock). In a non-volatile memory controller mode, for example, the command buffer 126 can further communicate (e.g., receive local commands) with the non-volatile memory controller 128 using a local communications interface supporting a physical layer communications protocol such as the LCOM interface protocol defined by JEDEC. In such cases, the Y clock can serve as a data clock for latching data signals provided by the non-volatile memory controller 128 at the DRAM devices (e.g., during data restore). In some cases, the command buffer 126 can also communicate (e.g., send control setting commands) with the data buffers using a data buffer control/communication or BCOM interface. Other signals shown in FIG. 2A include those pertaining to the 12C serial bus and the Save_n memory system signal (e.g., for invoking a backup operation at power loss).

Figure 2B:
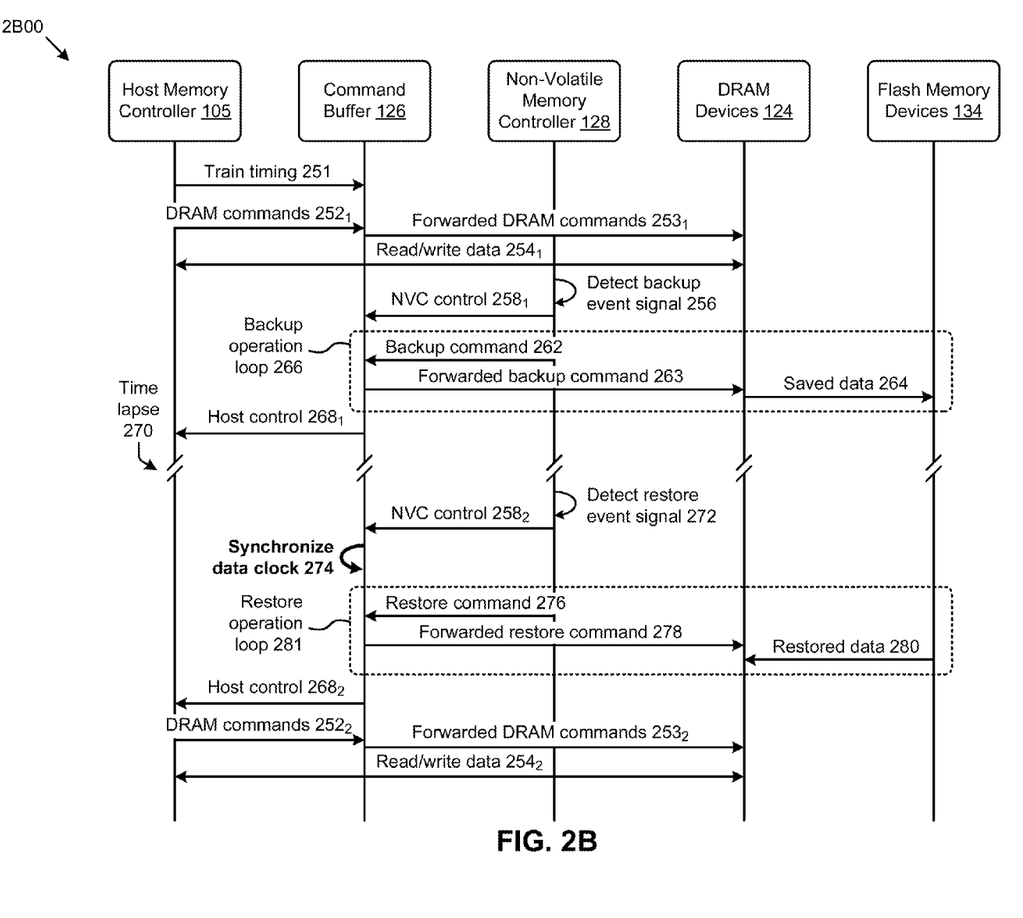
FIG. 2B is a diagram showing interactions among hybrid memory module components pertaining to backup and restore events.

The foregoing signals, interfaces, connections, and other components of the hybrid memory module 2A00 can be used to execute backup and restore operations as discussed in FIG. 2B.

FIG. 2B is a diagram showing interactions among hybrid memory module components 2B00 pertaining to backup and restore events. As an option, one or more instances of interactions among hybrid memory module components 2B00 or any aspect thereof may be implemented in the context of the architecture and functionality of the embodiments described herein. Also, the interactions among hybrid memory module components 2B00 or any aspect thereof may be implemented in any desired environment.

As shown in FIG. 2B, the interactions among hybrid memory module components 2B00 specifically pertain to interactions among the earlier described components comprising the host memory controller 105, the command buffer 126, the non-volatile memory controller 128, the collective set of DRAM devices 124, and the flash memory devices 134. Such components can exhibit a set of high-level interactions (e.g., operations, messages, etc.) as shown. Specifically, the interactions can pertain to backup and restore operations executed on a hybrid memory module. As shown, the host memory controller 105 might have control (e.g., in a host control mode) so as to train the timing of the hybrid memory module to facilitate read and/or write and/or other operations (see message 251). Such training might be performed only at initialization of the hybrid memory module to reduce the latency impact on memory access operations. The host memory controller 105 can further issue DRAM commands to the command buffer 126 (see message $252_1$) that might be forwarded to the DRAM devices 124 (see message $253_1$). In some cases, the DRAM commands can result in read and/or write data transferred between the host memory controller 105 and the DRAM devices 124 (see message $254_1$).

Such activity might continue until a data backup event signal is detected at the non-volatile memory controller 128 (see operation 256). For example, the host and/or the hybrid memory module might have detected the loss of power and triggered the data backup event. Such backup events can be invoked at the non-volatile memory controller 128 from the host memory controller 105 (e.g., via the command buffer 126), from the Save_n signal, and from the 12C bus. In response, control can be provisioned to the non-volatile memory controller 128 by, for example, writing to certain control register settings of the command buffer 126 (see message $258_1$). The non-volatile memory controller 128 can then begin to issue backup commands to the command buffer 126 (see message 262) that can be forwarded to the DRAM devices 124 (see message 263) to save data from the DRAM devices 124 to the flash memory devices 134 (see message 264). Such backup interactions can continue in a loop (see loop 266) until the backup operation is complete (e.g., all data is saved). When the backup operation is complete, control can be returned to the host (see message 268₁).

After a time lapse 270, a data restore event signal might be detected by the non-volatile memory controller 128 (see operation 272). For example, the line power to the computing system might have returned to trigger the data restore event. In response, control can be provisioned to the non-volatile memory controller 128 by, for example, writing to certain control register settings of the command buffer 126 (see message 258₂). The command buffer can then synchronize the data clock provided by the command buffer 126 to the DRAM devices 124 to facilitate writing of data to the DRAM devices 124 (see operation 274). The herein disclosed techniques can facilitate such data clock synchronization in hybrid memory modules. When the data clock has been synchronized, the non-volatile memory controller 128 can then begin to issue restore commands to the command buffer 126 (see message 276) that can be forwarded to the DRAM devices 124 (see message 278) to restore data from the flash memory devices 134 to the DRAM devices 124 (see message 280). Such restore interactions can continue in a loop (see loop 281) until the restore operation is complete (e.g., all data is restored).

When the restore is complete, the command buffer 126 can provision control to the host memory controller 105 (see message 268₂). The host memory controller 105 can then resume memory access operations by issuing DRAM commands to the command buffer 126 (see message 252₂) to be forwarded to the DRAM devices 124 (see message 253₂) to invoke, in some cases, the transfer of read and/or write data between the host memory controller 105 and the DRAM devices 124 (see message 254₂).

The hybrid memory module 2A00 and the interactions among hybrid memory module components 2B00 exemplify the need for the herein disclosed techniques (see operation 274). Specifically, the herein disclosed techniques address the problem of implementing a data clock that is synchronized with the data written to the DRAM during data restore operations, given the various asynchronous and/or synchronous (e.g., sequential) delay uncertainties that can be present in a hybrid memory module. Such uncertainties are discussed further as pertains to FIG. 3.

Figure 3:
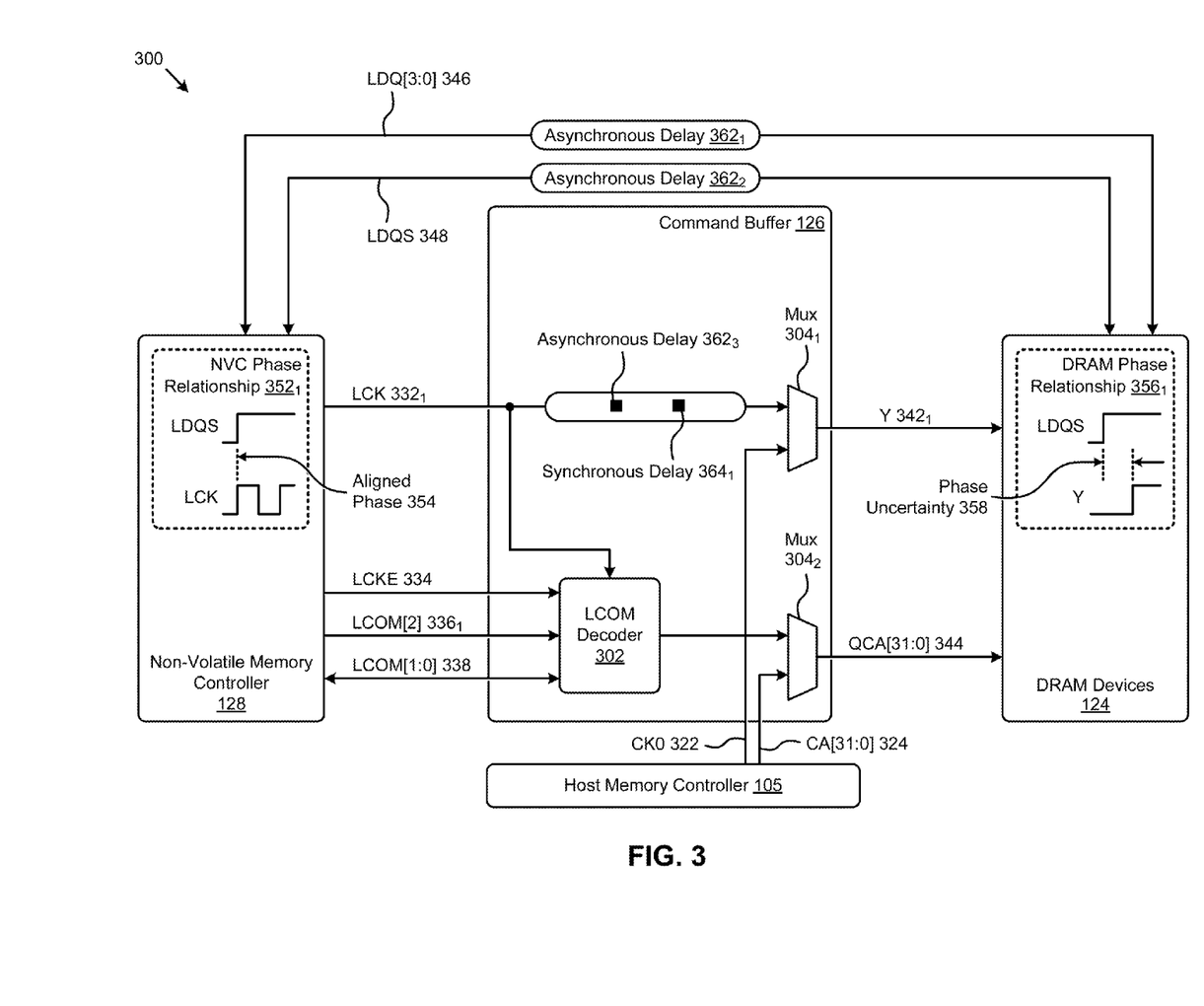
FIG. 3 is a schematic of hybrid memory module components illustrating data clock phase uncertainties in hybrid memory modules.

FIG. 3 is a schematic of hybrid memory module components 300 illustrating data clock phase uncertainties in hybrid memory modules. As an option, one or more instances of hybrid memory module components 300 or any aspect thereof may be implemented in the context of the architecture and functionality of the embodiments described herein. Also, the hybrid memory module components 300 or any aspect thereof may be implemented in any desired environment.

FIG. 3 shows the earlier described host memory controller 105, the DRAM devices 124, the command buffer 126, and the non-volatile memory controller 128. In some cases, the command buffer 126 can further comprise an LCOM decoder 302 and certain multiplexers (e.g., mux 304₁ and mux 304₂). Various signals communicated among and/or within the foregoing components are also shown. Specifically, for example, a host clock signal (e.g., CK0 322) from the host memory controller 105 or a local clock signal (e.g., LCK 332₁) from the non-volatile memory controller 128 can be selected by the mux 304₁ to generate a data clock signal (e.g., Y 342₁) for the DRAM devices 124. Also, host commands represented by certain signals (e.g., CA[31:0] 324) from the host memory controller 105 or local commands represented by certain signals (e.g., LCKE 334₁, LCOM[2] 336₁, and LCOM[1:0] 338) from the non-volatile memory controller 128 can be selected by the mux 304₂ to be issued as DRAM commands represented by certain signals (e.g., QCA[31:0] 344). For example, the signals from the host memory controller 105 might be used to generate the signals for the DRAM devices 124 in a host control mode. In other cases, the signals from the non-volatile memory controller 128 might be used to generate the signals for the DRAM devices 124 in a non-volatile memory controller mode.

FIG. 3 also shows certain data signals (e.g., LDQS 348 and LDQ[3:0] 346) coupling the non-volatile memory controller 128 and the DRAM devices 124. For a data restore operation in a non-volatile memory controller mode, saved data (e.g., from non-volatile flash memory devices) can be restored to the DRAM devices 124 by latching such data signals at the DRAM devices 124 using the data clock (e.g., Y 342₁) derived from the local clock (e.g., LCK 332₁). In some cases, the phase relationship between the data signals and the data clock signal might be uncertain. Specifically, for example, the LCK 332₁ signal and the LDQS 348 signal (e.g., representing the data signals) might have a phase relationship at the non-volatile memory controller 128 (e.g., NVC phase relationship 352₁) that exhibits an aligned phase 354. However, the LDQS 348 signal and the Y 342₁ data clock signal (e.g., derived from the LCK 332₁ signal) might exhibit a phase relationship at the DRAM devices 124 (e.g., DRAM phase relationship 356₁) having phase uncertainty 358. The phase uncertainty 358 might be attributed in part to the asynchronous delays (e.g., asynchronous delay 362₁ and asynchronous delay 362₂) associated with the data signals between the non-volatile memory controller 128 and the DRAM devices 124. For example, certain asynchronous delays (e.g., 1-2 ns) can correspond to gate delays, printed circuit board trace delays, and other delays. Further, the phase uncertainty 358 can be attributed in part to the asynchronous delays (e.g., asynchronous delay 362₃) and/or synchronous delays (e.g., synchronous delay 364₁) associated with the clock path through the command buffer 126. As an example, the delays can correspond to various logic stage delays (e.g., flip-flop delays, etc.), and/or other delays associated with generating the data clock (e.g., Y 342₁) from the local clock (e.g., LCK 332₁).

In some cases, the phase uncertainty 358 can exceed the tolerances of the timing required to reliably latch the data at the DRAM devices 124. In such cases, there is a need to synchronize the data clock signal to the data signals and/or the local clock signal. The herein disclosed techniques can address such needs as described in FIG. 4.

Figure 4:
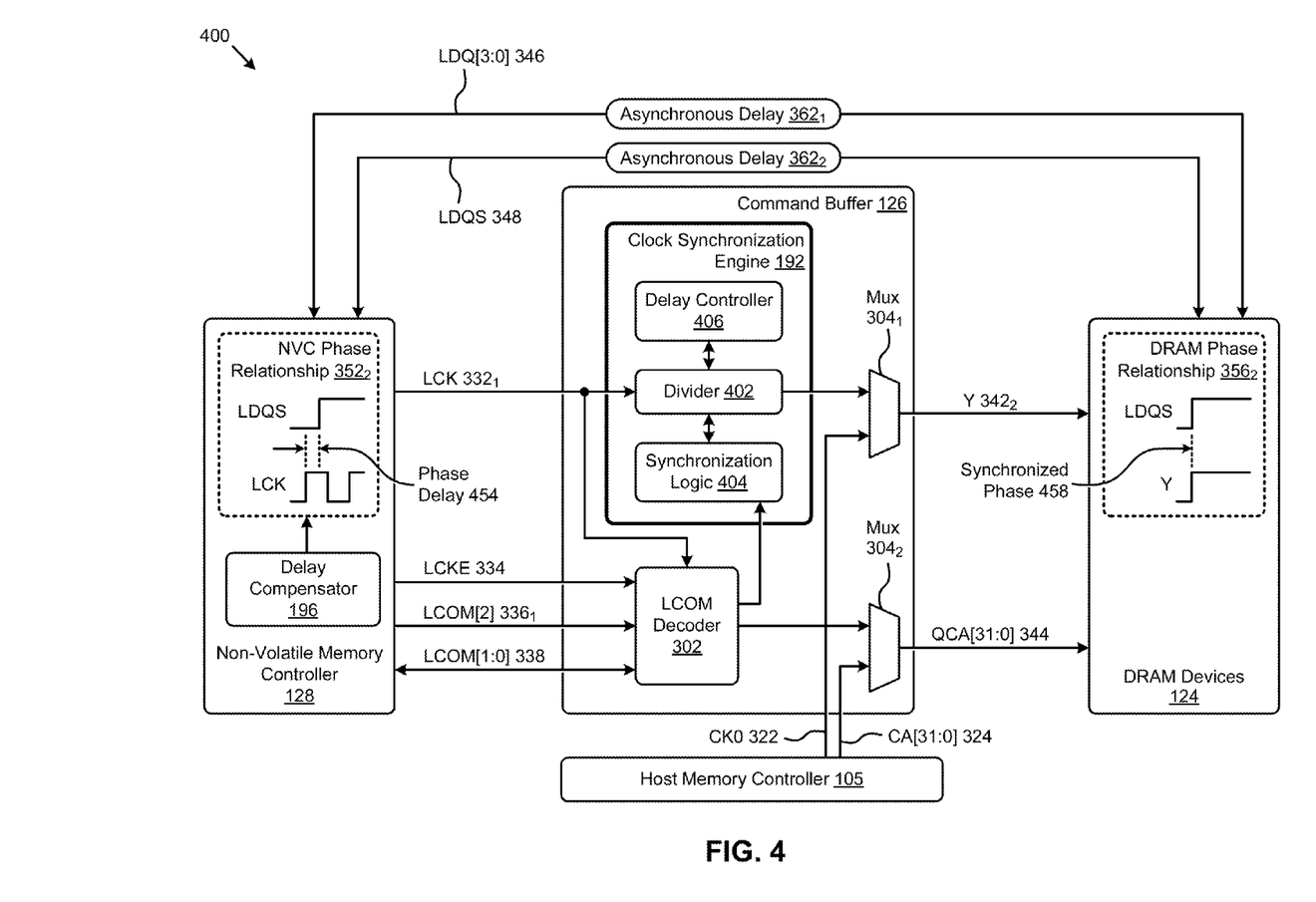
FIG. 4 depicts a data clock synchronization subsystem to facilitate data restore operations in hybrid memory modules, according to some embodiments.

FIG. 4 depicts a data clock synchronization subsystem 400 to facilitate data restore operations in hybrid memory modules. As an option, one or more instances of data clock synchronization subsystem 400 or any aspect thereof may be implemented in the context of the architecture and functionality of the embodiments described herein. Also, the data clock synchronization subsystem 400 or any aspect thereof may be implemented in any desired environment.

The data clock synchronization subsystem 400 shown in FIG. 4 comprises the components and signals described in FIG. 3. As highlighted in FIG. 4, the data clock synchronization subsystem 400 further depicts the clock synchronization engine 192 at the command buffer 126 and the delay compensator 196 at the non-volatile memory controller 128 to facilitate the herein disclosed techniques. Specifically, the clock synchronization engine 192 can use the local clock (e.g., LCK 332$_1$), having a phase delay 454 from the data signals (e.g., LDQS 348, LDQ[3:0], etc.) produced by the delay compensator 196, to generate a data clock (e.g., Y 342$_2$) that exhibits a synchronized phase 458 with the data signals at the DRAM devices 124 (e.g., DRAM phase relationship 356$_2$).

In some embodiments, the clock synchronization engine 192 can further comprise a divider 402, a set of synchronization logic 404, and a delay controller 406 to, in part, to facilitate generating a synchronized data clock with selectable frequencies. Specifically, the synchronization logic can monitor the LCOM decoder 302 to detect conditions that can invoke a clock synchronization event. For example, a local command indicating the start of a restore process can be detected by the synchronization logic 404 to trigger various data clock synchronization operations. The synchronization logic 404 might further comprise various counters to manage certain synchronous and/or synchronous delays associated with synchronization. The divider 402, for example, might also divide the local clock signal to generate a data clock having a frequency corresponding to the frequency of the data signals. The divider 402 might further facilitate the selection of certain divider values from a set of available divider values according to the timing requirements of the associated operations being executed. In some cases, the data clock frequency can equal the local clock signal frequency (e.g., no clock division) to provide a high speed data clock without overclocking the local clock. In some embodiments, the delay controller 406 can adjust the phase delay of the data clock using, for example, selectable delay elements to compensate for asynchronous delays in the command buffer 126. The delay compensator 196 can also compensate for certain asynchronous delays (e.g., asynchronous delay 362$_1$ and asynchronous delay 362$_2$) by adjusting the phase relationship (e.g., phase delay 454) between the phase of the data signals (e.g., LDQS 348 and LDQ[3:0] 346) and the phase of the local clock signal (e.g., LCK 332$_1$) at the non-volatile memory controller 128 (e.g., NVC phase relationship 352$_2$).

The data clock synchronization subsystem 400 presents merely one partitioning. The specific example shown is purely exemplary, and other partitioning is reasonable. A technique for generating a DRAM data clock having selectable frequencies that is synchronized with the data written to the DRAM implemented in such systems, subsystems, and partitioning choices is shown in FIG. 5.

Figure 5:
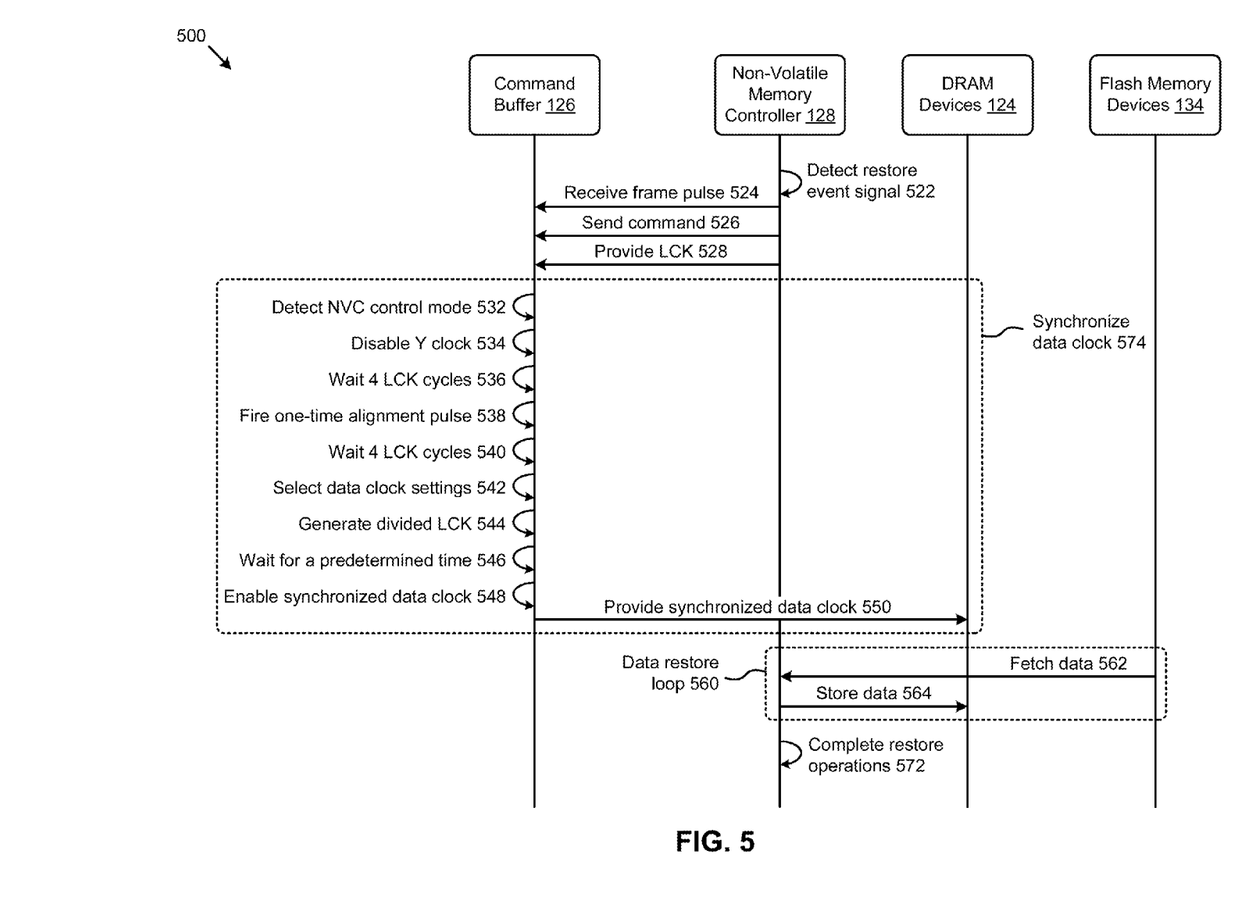
FIG. 5 is a diagram showing interactions in hybrid memory modules that implement a data clock synchronization subsystem to facilitate data restore operations, according to some embodiments.

FIG. 5 is a diagram showing interactions 500 in hybrid memory modules that implement a data clock synchronization subsystem to facilitate data restore operations. As an option, one or more instances of interactions 500 or any aspect thereof may be implemented in the context of the architecture and functionality of the embodiments described herein. Also, the interactions 500 or any aspect thereof may be implemented in any desired environment.

As shown in FIG. 5, the interactions 500 pertain to the earlier described components comprising the command buffer 126, the non-volatile memory controller 128, the collective set of DRAM devices 124, and the flash memory devices 134, according to the herein disclosed techniques for generating a DRAM data clock having selectable frequencies that is synchronized with the data written to the DRAM, such as required for certain data backup and data restore events. In one or more embodiments, the interactions 500 can be implemented using the data clock synchronization subsystem 400. As an example, the non-volatile memory controller 128 might detect a restore event signal (see operation 522). In response, the command buffer 126 can receive a frame pulse (see message 524) and a command (see message 526) from the non-volatile memory controller 128. The non-volatile memory controller 128 can further provide a local clock signal (LCK) to the command buffer 126 (see message 528).

According to the herein disclosed techniques, certain operations can be executed at the command buffer 126 to synchronize a data clock to facilitate the restore process (see grouping 574). Specifically, the command buffer 126 can detect a non-volatile memory controller mode from one or more of received local commands (see operation 532). The data clock from the command buffer 126 can then be disabled (see operation 534). After a wait of a certain quantity of local clock cycles (e.g., N LCK cycles) (see operation 536), the command buffer 126 can fire a one-time alignment pulse (see operation 538). For example, the alignment pulse might be used internally by the clock synchronization engine to align various logic stages. After a wait of a certain quantity of local clock cycles (e.g., N LCK cycles) (see operation 540), the command buffer 126 can select various data clock settings (see operation 542). For example, such settings might include a divider value, a programmable delay selection, and/or other settings. The command buffer 126 can then generate the divided LCK according to the selected data clock settings (see operation 544). After a wait of a certain quantity of local clock cycles (e.g., N LCK cycles) (see operation 546), the synchronized data clock output can be enabled (see operation 548) and provided to the DRAM devices 124 (see message 550). As an example, the command buffer 126 might wait (see operation 546) for certain logic stages to flush, and/or other settling to occur before availing the synchronized data clock to the DRAM devices 124.

Using the synchronized data clock, the non-volatile memory controller 128 can then begin to fetch data from the flash memory devices 134 (see message 562) to store (e.g., "restore") on the DRAM devices 124 (see message 564). For example, the data signals representing the fetched data can be latched at the DRAM devices 124 using the synchronized data clock. Such restore interactions can continue in a loop (see loop 560) until the restore operation is complete (see operation 572).

Figure 6:
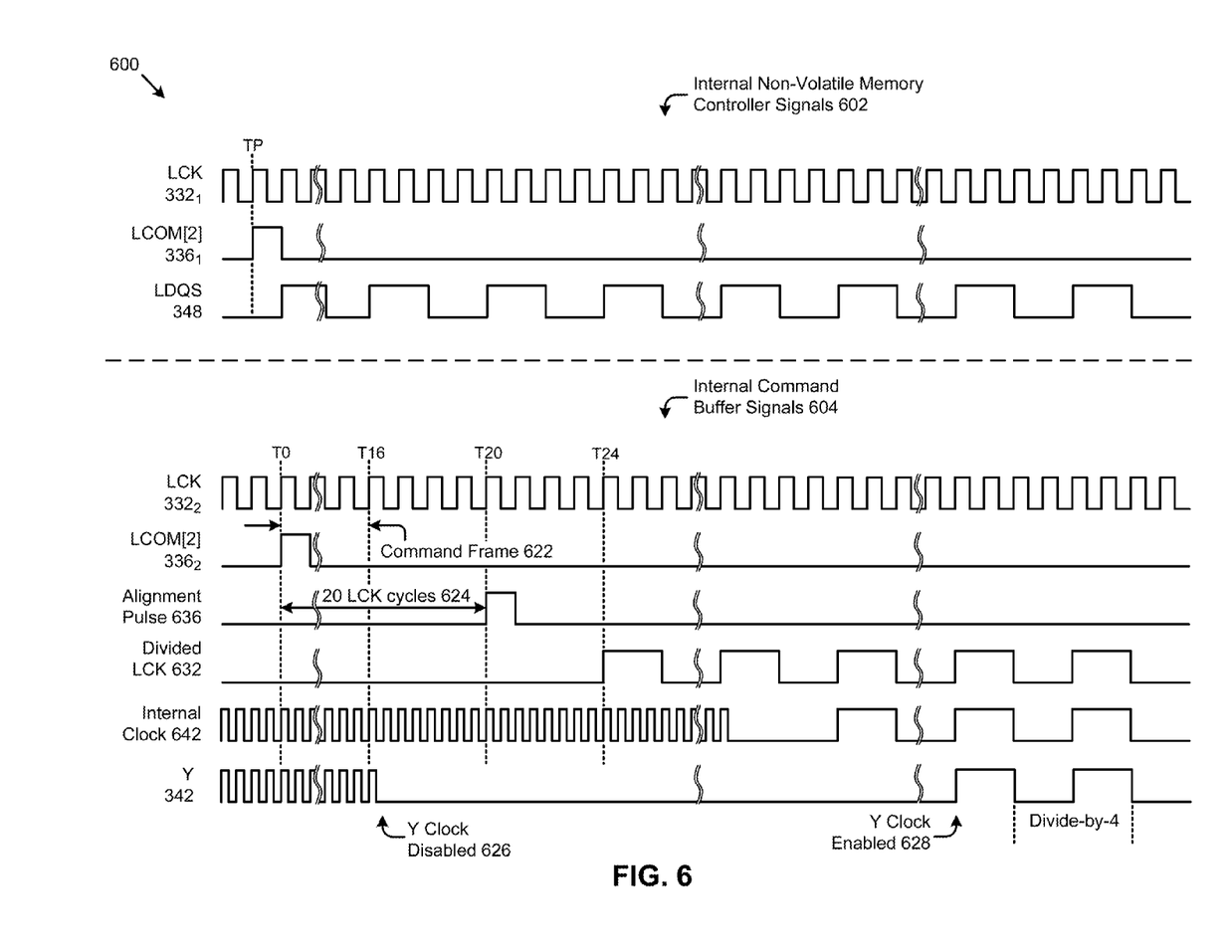
FIG. 6 presents annotated timing diagrams for hybrid memory modules that implement a data clock synchronization subsystem to facilitate data restore operations, according to some embodiments.

The timing attributes associated with select signals used to implement one embodiment of the herein disclosed techniques is described in more detail in FIG. 6 and the associated disclosure.

FIG. 6 presents annotated timing diagrams 600 for hybrid memory modules that implement a data clock synchronization subsystem to facilitate data restore operations. As an option, one or more instances of annotated timing diagrams 600 or any aspect thereof may be implemented in the context of the architecture and functionality of the embodiments described herein. Also, the annotated timing diagrams 600 or any aspect thereof may be implemented in any desired environment.

As shown in FIG. 6, the annotated timing diagrams 600 comprise signal timing sequences for a selected set of internal non-volatile memory controller signals 602 and a selected set of internal command buffer signals 604. The annotated timing diagrams 600 represent signal waveforms in hybrid memory modules implementing the herein disclosed techniques for data clock synchronization. Specifically, the internal non-volatile memory controller signals 602 comprise a local clock signal (e.g., LCK 332$_1$) provided by a non-volatile memory controller in a hybrid memory module. The internal non-volatile memory controller signals 602 further show a frame pulse issued at time TP (e.g., LCOM[2] 336₁), and a reference data signal (e.g., LDQS 348). For example, the frame pulse can indicate that a local command will be issued from the non-volatile memory controller to the command buffer.

The internal command buffer signals 604 comprise an instance of the local clock (e.g., LCK 332₂) received at a command buffer in the hybrid memory module. An instance of the frame pulse signal (e.g., LCOM[2] 336₂) received at the command buffer at time T0 is also shown. In some cases, the delay between the time TP of the frame pulse at the non-volatile memory controller and the time T0 of the frame pulse at the command buffer can be attributed to various asynchronous delays. In some cases, the command frame (e.g., command frame 622) following the frame pulse can be received in 16 LCK cycles (e.g., T0 to T16). In the shown example, the command might establish a non-volatile memory controller mode, such that the data clock (e.g., Y 342) is disabled (e.g., Y clock disabled 626). In this case, the waveform of Y 342 depicts that the data clock was derived from the host clock prior to the disable event. Four LCK cycles following the command frame 622 (e.g., at T20) an alignment pulse (e.g., alignment pulse 636) can be issued. For example, such an alignment pulse can be used internally by a clock synchronization engine to align various logic stages to facilitate the synchronization process. Four LCK cycles following the alignment pulse (e.g., at T24), an internal divided LCK can be produced (e.g., divided LCK 632). As shown, the divided LCK 632 and the LDQS 348 are phase aligned. In some cases, the timing of the alignment pulse 636 and/or the delay from the alignment pulse 636 to the first edge of the divided LCK 632 can be pre-determined to compensate for certain synchronous delays at the command buffer. For example, the alignment pulse can be issued 20 local clock cycles (e.g., 20 LCK cycles 624) after the frame pulse. Near this time, an internal clock 642 might also switch to being sourced from the divided LCK 632 (e.g., from being sourced by the host clock). As shown, the internal clock 642 is also synchronized with the LDQS 348 signal. Following a certain delay (e.g., for settling), the data clock output is enabled (e.g., Y clock enabled 628) to provide a synchronized data clock according to the herein disclosed techniques. For example, the internal clock 642 might drive the Y 342 clock signal through an inverting buffer. In the example shown, a "divide-by-4" relationship (e.g., divider value of 4) between the data clock (e.g., Y 342) and the local clock (e.g., LCK 332₂) is shown. Other divider values, including divide-by-1, are possible.

Additional Examples

It should be noted that there are alternative ways of implementing the embodiments disclosed herein. Accordingly, the embodiments and examples presented herein are to be considered as illustrative and not restrictive, and the claims are not to be limited to the details given herein, but may be modified within the scope and equivalents thereof.

ADDITIONAL EMBODIMENTS OF THE DISCLOSURE

In the foregoing specification, the disclosure has been described with reference to specific embodiments thereof. It will, however, be evident that various modifications and changes may be made thereto without departing from the broader spirit and scope of the disclosure. For example, the above-described process flows are described with reference to a particular ordering of process actions. However, the ordering of many of the described process actions may be changed without affecting the scope or operation of the disclosure. The specification and drawings are, accordingly, to be regarded in an illustrative sense rather than in a restrictive sense.

What is claimed is:

1. A memory system comprising:
   one or more DRAM devices;
   at least one non-volatile memory controller coupled to the DRAM devices to send one or more data signals to the DRAM devices;
   at least one command buffer coupled to the non-volatile memory controller and the DRAM devices, to receive a local clock signal from the non-volatile memory controller, and to provide at least one synchronized data clock signal to the DRAM devices; and
   a clock synchronization engine at the command buffer to generate the synchronized data clock signal based at least in part on the local clock signal, wherein a first phase relationship between the synchronized data clock signal and the data signals facilitate latching of the data signals at the DRAM devices, and wherein the first phase relationship compensates for at least one of, one or more synchronous delays, or one or more asynchronous delays.

2. The memory system of claim 1, further comprising a divider to determine a data clock signal frequency corresponding to the synchronized data clock signal based at least in part on a local clock signal frequency corresponding to the local clock signal.

3. The memory system of claim 2, wherein the data clock signal frequency is related to the local clock signal frequency by a divider value.

4. The memory system of claim 3, wherein the divider value is selectable from a plurality of available divider values.

5. The memory system of claim 4, wherein the available divider values comprise at least one of, 4, 2, or 1.

6. The memory system of claim 1, further comprising a set of synchronization logic to issue an alignment pulse to trigger the clock synchronization engine to generate the synchronized data clock signal.

7. The memory system of claim 6, wherein the alignment pulse is issued responsive to a local command received at the command buffer.

8. The memory system of claim 6, wherein the synchronized data clock signal is enabled a second quantity of local clock cycles associated with the local clock signal following the alignment pulse.

9. The memory system of claim 6, wherein the alignment pulse is issued a first quantity of local clock cycles associated with the local clock signal following a frame pulse received at the command buffer from the non-volatile memory controller.

10. The memory system of claim 9, wherein the first quantity of local clock cycles is based at least in part on the synchronous delays.

11. The memory system of claim 1, further comprising a delay controller to select one or more programmable delay elements.

12. The memory system of claim 11, wherein the programmable delay elements are selected based at least in part the asynchronous delays.

13. The memory system of claim 1, further comprising a delay compensator to generate a phase delay characterizing a second phase relationship between the local clock signal and the data signals.

14. The memory system of claim 13, wherein the phase delay is determined based at least in part on the asynchronous delays.

15. The memory system of claim 13, wherein the phase delay is generated by selecting one or more programmable delay elements.

16. The memory system of claim 1, further comprising one or more flash memory devices.

17. The memory system of claim 16, wherein the data signals represent a set of data stored on the flash memory devices.

18. The memory system of claim 1, wherein the data signals are latched at the DRAM devices in at least one burst.

19. The memory system of claim 1, wherein the synchronous delays comprise at least one of, a deterministic delay, a logic stage delay, or a flip-flop delay.

20. The memory system of claim 1, wherein the asynchronous delays comprise at least one of, a propagation delay, a gate delay, a buffer delay, or a printed circuit board trace delay.

* * * * *